US009246081B2

(12) United States Patent
Ohnishi et al.

(10) Patent No.: US 9,246,081 B2
(45) Date of Patent: Jan. 26, 2016

(54) METHOD FOR MANUFACTURING PIEZOELECTRIC ELEMENT

(75) Inventors: Takao Ohnishi, Fuso-Town (JP); Masayuki Uetani, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 1068 days.

(21) Appl. No.: 13/271,597

(22) Filed: Oct. 12, 2011

(65) Prior Publication Data

US 2012/0117769 A1    May 17, 2012

(30) Foreign Application Priority Data

Nov. 11, 2010    (JP) ................................. 2010-253013

(51) Int. Cl.
*H01L 41/257*    (2013.01)
*H01L 41/04*    (2006.01)
(Continued)

(52) U.S. Cl.
CPC .............. *H01L 41/257* (2013.01); *H01L 41/04* (2013.01); *H01L 41/053* (2013.01); *H01L 41/0926* (2013.01); *H01L 41/0933* (2013.01); *H01L 41/0973* (2013.01); *H01L 41/27* (2013.01); *H01L 41/29* (2013.01); *H01L 41/332* (2013.01); *B06B 1/0603* (2013.01); *B06B 1/0688* (2013.01); *B06B 1/0696* (2013.01); *F16K 31/005* (2013.01); *H01L 41/338* (2013.01); *H03H 3/02* (2013.01); *H03H 9/172* (2013.01); *H03H 9/178* (2013.01); *H03H 2003/022* (2013.01); *H03H 2003/023* (2013.01); *H03H 2003/027* (2013.01); (Continued)

(58) Field of Classification Search
CPC ... H01L 41/04; H01L 41/053; H01L 41/0926; H01L 41/0933; H01L 41/332; H01L 41/338; H01L 41/27; H01L 41/29; H01L 41/257; H01L 41/0973; B06B 1/0603; B06B 1/0688; B06B 1/0696; H03H 9/172; H03H 9/178; H03H 2003/02; H03H 2003/022; H03H 2003/023; H03H 2003/027; Y10T 29/42; Y10T 29/49005; Y10T 29/49155; Y10T 29/49156; Y10T 29/49798; F16K 31/005
USPC ........ 29/25.35, 594, 846, 847, 417; 310/330, 310/332, 357, 359; 257/415
See application file for complete search history.

(56) References Cited

U.S. PATENT DOCUMENTS 4,237,399 A * 12/1980 Sakamoto ..................... 310/332
4,783,888 A * 11/1988 Fujii et al. ................... 29/25.35
(Continued)

FOREIGN PATENT DOCUMENTS

CN    101213680 A    7/2008
EP    1 693 907 A1    8/2006
(Continued)

OTHER PUBLICATIONS

Japanese Office Action (Application No. 2010-253013) dated Aug. 26, 2014 (with English translation).
(Continued)

*Primary Examiner* — A. Dexter Tugbang
(74) *Attorney, Agent, or Firm* — Burr & Brown, PLLC

(57) ABSTRACT

There is provided a method for manufacturing a piezoelectric element, the method having a step of polarizing the fired piezoelectric body while fixing at least two positions in a direction perpendicular to the polarization direction. The method is a means for obtaining a piezoelectric element provided with a thin and flat fired piezoelectric body with no warpage.

13 Claims, 4 Drawing Sheets

(51) Int. Cl.
  *H01L 41/053* (2006.01)
  *H01L 41/09* (2006.01)
  *H01L 41/332* (2013.01)
  *H01L 41/27* (2013.01)
  *H01L 41/29* (2013.01)
  *B06B 1/06* (2006.01)
  *H03H 9/17* (2006.01)
  *H03H 3/02* (2006.01)
  *F16K 31/00* (2006.01)
  *H01L 41/338* (2013.01)

(52) U.S. Cl.
  CPC ............ *Y10T29/42* (2015.01); *Y10T 29/49005* (2013.01); *Y10T 29/49155* (2013.01); *Y10T 29/49156* (2015.01); *Y10T 29/49798* (2015.01)

(56) References Cited

U.S. PATENT DOCUMENTS

| | | | | |
|---|---|---|---|---|
| 6,383,411 | B1 * | 5/2002 | Sawada et al. | H03H 9/178 |
| 6,953,977 | B2 * | 10/2005 | Mlcak et al. | 257/415 |
| 7,561,010 | B2 * | 7/2009 | Hikita et al. | H03H 9/178 |
| 2005/0140249 | A1 | 6/2005 | Kita et al. | |
| 2006/0279170 | A1 | 12/2006 | Yasui | |
| 2008/0030102 | A1 | 2/2008 | Ohnishi et al. | |
| 2008/0098582 | A1 | 5/2008 | Ohnishi et al. | |
| 2008/0111453 | A1 | 5/2008 | Yoshioka et al. | |
| 2009/0174419 | A1 | 7/2009 | Ohnishi et al. | |
| 2009/0242813 | A1 * | 10/2009 | Hirata et al. | F16K 31/005 |
| 2010/0242242 | A1 * | 9/2010 | Shimizu et al. | 29/25.35 |

FOREIGN PATENT DOCUMENTS

| | | | | |
|---|---|---|---|---|
| JP | 01084675 | A * | 3/1989 | ................. 29/25.35 |
| JP | 2001-068751 | A1 | 3/2001 | |
| JP | 2004-296783 | A1 | 10/2004 | |
| JP | 2006-261656 | A1 | 9/2006 | |
| WO | 2008/102481 | A1 | 8/2008 | |

OTHER PUBLICATIONS

Chinese Office Action (Application No. 201110309740) dated Jun. 18, 2014.

Extended European Search Report (Application No. 11185317.2) dated Jan. 2, 2014.

* cited by examiner

METHOD FOR MANUFACTURING PIEZOELECTRIC ELEMENT

BACKGROUND OF THE INVENTION

The present invention relates to a method for manufacturing a piezoelectric element provided with a thin and flat fired piezoelectric body with no warpage.

Recently, there has been desired a displacement control device capable of adjusting the optical path length and position in submicrometer in the fields of optics, precision machinery, semiconductor manufacturing, etc. In response to this, there is proceeding development of piezoelectric devices such as a piezoelectric actuator utilizing strain (displacement, change in shape) based on the reverse piezoelectric effect caused upon applying an electric field to a piezoelectric body and a piezoelectric sensor utilizing charge generation (polarization) caused upon applying stress to a piezoelectric body on the basis of a piezoelectric effect.

The core of these piezoelectric devices is a piezoelectric element obtained by putting a piezoelectric body between electrodes. Of these, the piezoelectric body can be manufactured by forming a piezoelectric material into a film shape by a thin film method and firing it at high temperature (hereinbelow, a piezoelectric body obtained in this way is referred to as a fired piezoelectric body). Since, in the fired piezoelectric body, the direction of intrinsic polarization (bias of charge) is not oriented if the fired piezoelectric body is left as it is, almost no strain is generated, and it cannot be used as a piezoelectric element.

Therefore, in a manufacturing process of a piezoelectric element formed by putting a fired piezoelectric body between electrodes, the piezoelectric element is generally subjected to a polarization treatment. The polarization treatment is generally performed just before the final step of cleaning or the like. The target of the polarization treatment is naturally the fired piezoelectric body constituting the piezoelectric element. The polarization treatment is generally performed by applying a voltage of several kV/mm for about several tens of minutes in the atmosphere or in a liquid. In the polarized fired piezoelectric body (piezoelectric element), the direction of the intrinsic polarization is oriented to almost the same direction and is not reposited to have a polarization value (remnant polarization) even without applying any voltage. Then, a voltage is applied to this (an electric field is applied), strain (displacement, deformation) is generated on the basis of the amount of the voltage.

DESCRIPTION OF RELATED ART

An example of the prior art document relating to the polarization of a piezoelectric body (piezoelectric porcelain) is JP-2004-296783. In the JP-2004-296783, there is a description of a polarization method having small deterioration of piezoelectric properties with the passage of time. Specifically, there are disclosed a means for applying a high-frequency electric field, a means for applying a compression force parallel to the polarization direction, etc.

By the way, in accordance with downsizing, thinning, and energy saving of electronic devices in recent years, thinning and downsizing are required for a piezoelectric device mounted on the electronic devices and a piezoelectric element constituting the piezoelectric device. In addition, a piezoelectric device (piezoelectric actuator) may employ a structure where a piezoelectric element is bonded to a metal board as described in JP-2001-068751. In such a mode, the area where the piezoelectric element is bonded to the metal board is varied unless the piezoelectric element is flat, and it is difficult to obtain a predetermined displacement. In addition, for a flat piezoelectric element, a flat fired piezoelectric body is necessary. Thus, it can be said that a thin, flat fired piezoelectric body with no warpage is desired in a piezoelectric element.

However, since a thin fired piezoelectric body can be obtained through processing and firing, there is easily generated a difference in the crystal orientation degree, the crystal formation, or the intrinsic polarization state between the front and back surfaces of the fired piezoelectric body in the process prior to processing and firing. Therefore, warpage is caused upon the polarization treatment, and it is difficult to obtain a flat fired piezoelectric body (piezoelectric element) with no warpage after the polarization treatment. In addition, for example, if the polarization treatment is performed with applying a compression force parallel to the polarization direction according to the polarization method disclosed in JP-A-2004-296783, the piezoelectric element (fired piezoelectric body) may be damaged.

SUMMARY OF THE INVENTION

The present invention has been made in view of the aforementioned circumstances and aims to provide a means for obtaining a piezoelectric element provided with a thin and flat fired piezoelectric body with no warpage and no breakage. As a result of repeated study, it has been found out that the problems can be solved by polarizing the fired piezoelectric body (piezoelectric element) while fixing it at least two positions (from two directions) in a direction perpendicular to the polarization direction.

That is, in the first place, according to the present invention, there is provided a method for manufacturing a piezoelectric element having a thin board-shaped fired piezoelectric body and a film-shaped electrode formed on both the surfaces of the fired piezoelectric body; wherein the method has a step of polarizing the fired piezoelectric body while fixing it at least two positions in a direction perpendicular to the polarization direction.

The step of polarizing the fired piezoelectric body (polarization treatment step) is generally located at almost the end of the entire manufacturing process for a piezoelectric element. The piezoelectric element before the polarization may be manufactured by any means. The polarization direction means a direction (orientation) of the intrinsic polarization to be oriented. The polarization direction is generally perpendicular to the surface direction of a pair of electrodes facing each other, and, in the case of a thin board-shaped fired piezoelectric body, since a pair of electrodes are formed on the surface perpendicular to the thickness direction of the fired piezoelectric body, the thickness direction serves as the polarization direction. In addition, in this case, the direction perpendicular to the polarization direction is a surface direction of the electrode provided on the surface of the thin board-shaped fired piezoelectric body. Therefore, the positions where the fired piezoelectric body is fixed are in a surface direction of the thin board-shaped fired piezoelectric body. Preferably, the positions where the fired piezoelectric body is fixed are the end portions of the thin board-shaped fired piezoelectric body.

In addition, in a method for manufacturing a piezoelectric element of the present invention, it is preferable that the thin board-shaped fired piezoelectric body is fixed at both the ends in the longitudinal direction of the fired piezoelectric body.

The longitudinal direction of the thin board-shaped fired piezoelectric body means the direction where the distance from one end to the other end through the gravity center is the longest when the thin board-shaped fired piezoelectric body is considered as a plane shape. When the thin board-shaped fired piezoelectric body is circular, the longitudinal direction is not specified, and, when it is square, the longitudinal direction is not specified as long as the direction is limited to the direction of a side. However, in the other cases, the direction is specified.

In a method for manufacturing a piezoelectric element of the present invention, it is preferable that the fired piezoelectric body is fixed by holding the fired piezoelectric body from plural directions for one fixed portion at the positions where the thin board-shaped fired piezoelectric body is fixed.

Holding the fired piezoelectric body from plural directions for one fixed portion means the mode where the portion holding the fired piezoelectric body is separated at the positions where the fired piezoelectric body is fixed.

In a method for manufacturing a piezoelectric element of the present invention, it is preferable that the positions where the thin board-shaped fired piezoelectric body is fixed are cut after the polarization. In this case, the cutting means is preferably one selected from the means consisting of an electron beam, an ion beam, etching, blasting, and laser processing.

Next, according to the present invention, there is provided a method for polarizing a fired piezoelectric body, where the thin board-shaped fired piezoelectric body is fixed at least two positions in a direction perpendicular to the polarization direction to polarize the fired piezoelectric body.

In a method for manufacturing a piezoelectric element of the present invention and in a method for polarizing a fired piezoelectric body of the present invention, the polarization treatment is performed by applying a voltage of several kV/mm for about several tens minutes in the ambient atmosphere or in a liquid. Preferably, it is performed by applying a voltage of 1 to 16 kV/mm for about 1 to 30 minutes in the ambient atmosphere. A more preferable voltage is 2 to 10 kV/mm, and more preferable time of application is 5 to 20 minutes.

Incidentally, in the present specification, piezoelectric or piezoelectric body is referred. An object made of a material exhibiting strain induced by an electric field and requiring a polarization treatment is included in the piezoelectric body. Generally, almost all the objects made of ferroelectric material are included in this. However, an object made of an electrostrictive material which does not require a polarization treatment is excluded.

EFFECT OF THE INVENTION

In a method for manufacturing a piezoelectric element of the present invention and a polarization method of the fired piezoelectric body of the present invention, since the fired piezoelectric body is polarized by being fixed at least two positions in a direction perpendicular to the polarization direction, warpage is hardly caused even though the fired piezoelectric body is thin board-shaped to be able to obtain a flat fired piezoelectric body (piezoelectric element). The fired piezoelectric body (piezoelectric element) is not destroyed during the polarization treatment, and a polarized piezoelectric element (fired piezoelectric body) can be manufactured well. This is because, by the fixing at two or more positions in a direction perpendicular to the polarization direction, the deformation is suppressed, and the internal stress (deformation stress) generated by polarization and trying to deform is converted into elongation and deflection deformation in the fixed portions at the two or more positions.

The aforementioned effect can stably be obtained when the fixing is performed at three or more positions in the direction perpendicular to the polarization direction in comparison with the case of two positions. That is, there can be obtained a more flat (excellent in flatness) fired piezoelectric body (piezoelectric element) with hardly having warpage and with less damages such as a crack after the polarization treatment. However, since the fixing positions (fixed portions) should be cut later, the manufacturing process becomes complex. Therefore, it is particularly preferable to fix the fired piezoelectric body at two to four positions in accordance with the shape of the electrode.

The aforementioned effect can be obtained wherever the positions for fixing the thin board-shaped fired piezoelectric body are located in comparison with a method excluded from the methods for manufacturing a piezoelectric element of the present invention. However, in a method for manufacturing a piezoelectric element of the present invention, since the positions where the thin board-shaped fired piezoelectric body is fixed are at both the ends in the longitudinal direction of the fired piezoelectric body in a preferable mode, the aforementioned effect can stably be obtained in comparison with a case different from this mode. That is, the fired piezoelectric body (piezoelectric element) is more flat (excellent in flatness) with hardly generating warpage. The possibility of having damages in a fired piezoelectric body (piezoelectric element) during the polarization treatment is reduced.

Since, in a method for manufacturing a piezoelectric element of the present invention, the fired piezoelectric body is fixed by holding the fired piezoelectric body from plural directions (at one position) in positions where the thin board-shaped fired piezoelectric body is fixed in a preferable mode, the aforementioned effect can stably be obtained in comparison with a case different from this mode. That is, the fired piezoelectric body (piezoelectric element) is more flat (excellent in flatness) with hardly generating warpage. The possibility of having damages in a fired piezoelectric body (piezoelectric element) during the polarization treatment is reduced. This is because the internal stress (deformation stress) generated by polarization and trying to deform is converted into elongation and deflection deformation in the fixed portions other than the portion to be a piezoelectric element in a direction perpendicular to the polarization direction and portions held from plural directions.

Since, in a method for manufacturing a piezoelectric element of the present invention, the positions where the thin board-shaped fired piezoelectric body is fixed are cut after the polarization in a preferable mode, a flat piezoelectric element having little warpage can be obtained. That is, since no stress due to polarization remains, it is possible to obtain a piezoelectric element in the same state as the fixed state even after the fixed positions are cut off. In addition, if the means for cutting is one selected from the means consisting of an electron beam, an ion beam, etching, blasting, and laser processing, it is possible to cut the fixed positions in a state of having less processing stress to the piezoelectric element than the other means and to obtain a piezoelectric element having little warpage and the like.

REFERENCE NUMERALS

1: fired piezoelectric body, 11: through-hole, 21: green sheet, 22: reinforcer, 23: reinforcer-provided fired piezoelectric body, 33: electrode, 34: electrode, 38: resist, 39: resin, 41: bonding portion, 42: bonding portion, 42a: bonding portion, 42b: bonding portion, 53a: bonding portion, 53b: bonding portion, 63a: bonding portion, 63b: bonding portion, 73: through-hole, 74: through-hole, 100: piezoelectric element, 100B: piezoelectric element precursor

DETAILED DESCRIPTION OF THE INVENTION

Embodiments of the present invention will be described with appropriately referring to drawings. However, the present invention should not be construed with limiting to these embodiments, and various changes, modifications, and improvements may be made on the basis of knowledge of a person of ordinary skill in the art as long as they do not deviate from the scope of the present invention. For example, though the drawings show preferable embodiments of the present invention, the present invention is by no means limited to the modes shown by the drawings or information shown by the drawings. In carrying out or examining the present invention, though the same means as or a means equivalent to a means described in the present specification can be applied, a suitable means is a means described below.

Figure 3:
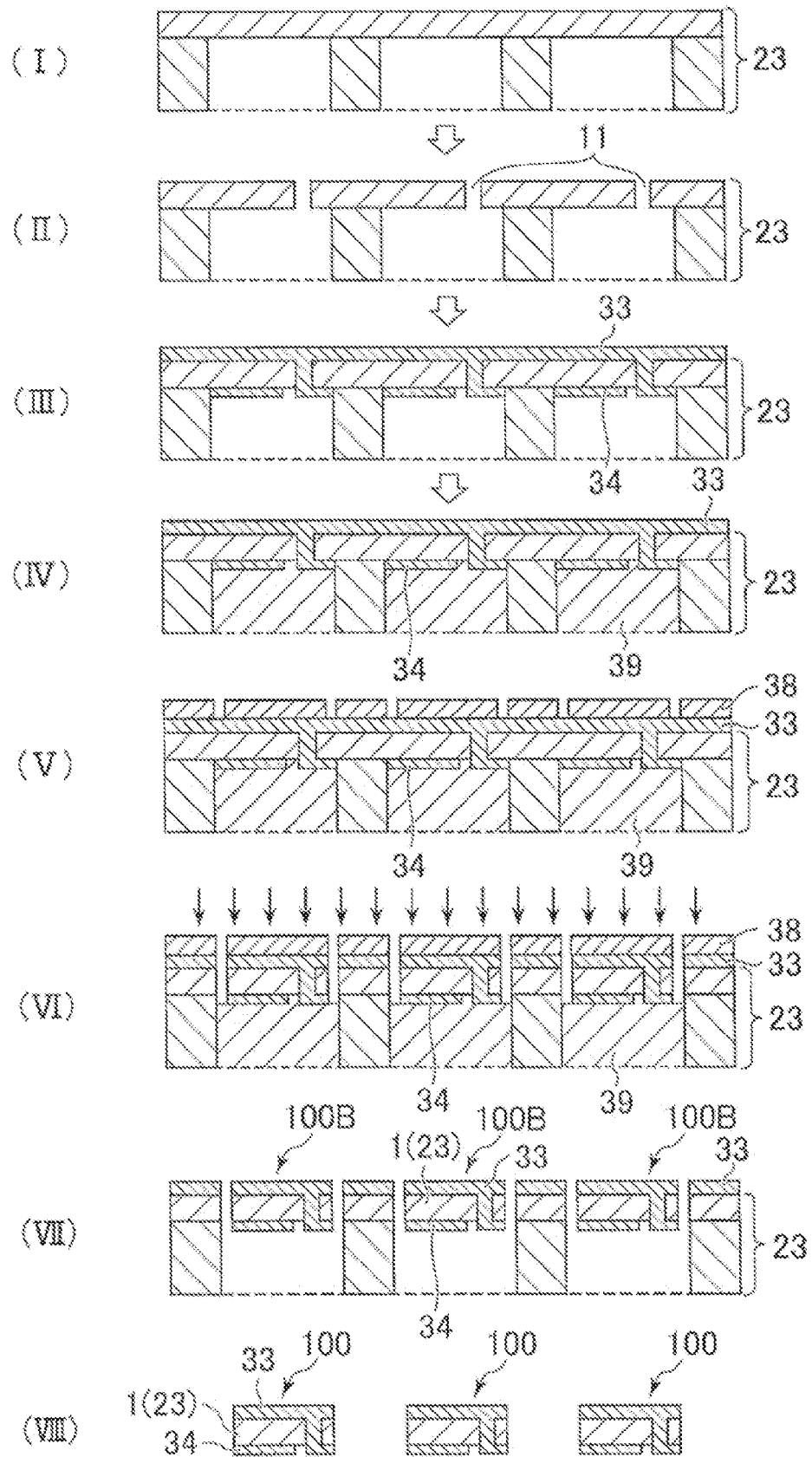
FIG. 3 is a cross-sectional view showing an embodiment of a method for manufacturing a piezoelectric element of the present invention, showing the steps (I) to (VIII).
Figure 4:
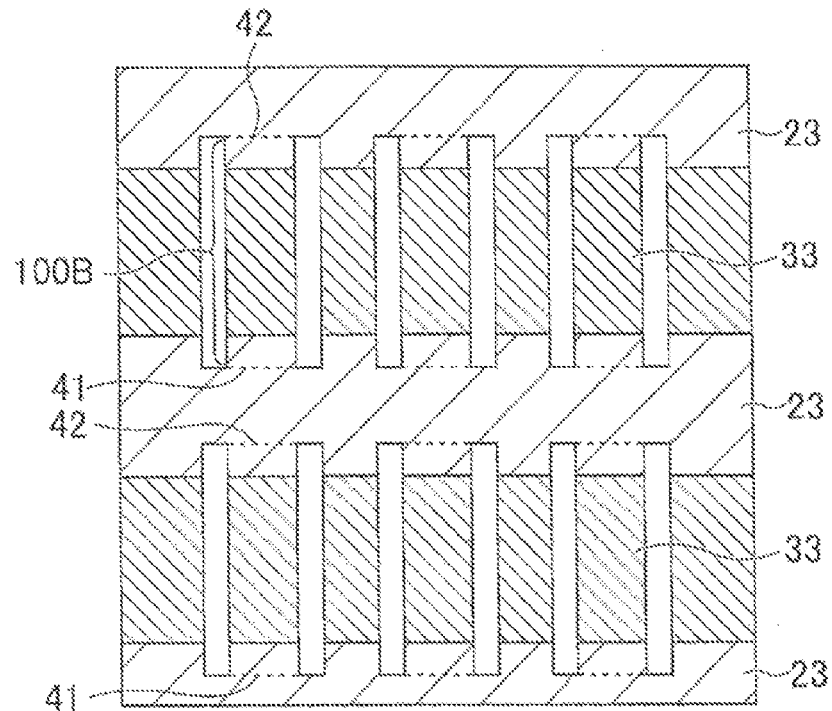
FIG. 4 is a plan view (top view) showing an embodiment of a method for manufacturing a piezoelectric element of the present invention, showing the step (VII) in FIG. 3.

Incidentally, a method for manufacturing a piezoelectric element of the present invention described below is a method for manufacturing plural piezoelectric elements at the same time. Though six elements are taken in the example of FIG. 4 described later, naturally, it is possible to take several tens or more in mass production. In addition, though the state of the step (VII) in FIG. 3 is shown in FIG. 4, which is a plan view, whereas FIG. 3 is a cross-sectional view. FIG. 3 showing the steps shows cross-sectional views each cut along a plane perpendicular to the longitudinal direction of a piezoelectric element. In other words, the step (VII) of FIG. 3 shows a cross section cut along a horizontal direction (left to right direction) including piezoelectric elements in FIG. 4. All the drawings including these drawings are schematic views drawn so that the manufacturing process can easily be understood, and, for example, it should naturally be understood that the thickness of the fired piezoelectric body and the thickness of the electrode are not described in a practically preferable state.

Figure 1:
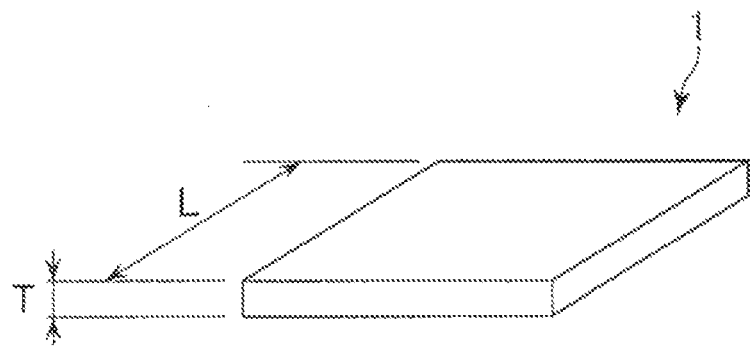
FIG. 1 is a perspective view showing an embodiment of a fired piezoelectric body.

Since a method for manufacturing a piezoelectric element of the present invention is a method for obtaining a piezoelectric element provided with a thin and flat fired piezoelectric body with no warpage, in the first place, a fired piezoelectric body will be described. The fired piezoelectric body 1 shown in FIG. 1 is a single layer piezoelectric body. Though the fired piezoelectric body 1 has an almost square planar shape, there is no particular limitation on the outer shape of the fired piezoelectric body. In consideration of productivity, it is desirable that the outer shape can be obtained by machining, and the shape is preferably a shape formed by straight lines, such as a polygon, particularly a square or a rectangle.

Though a piezoelectric element obtained by a method for manufacturing a piezoelectric element of the present invention is not illustrated, it is obtained by forming a film-shaped electrode on both the surfaces of the fired piezoelectric body 1 shown in FIG. 1. The piezoelectric element may have a mode having both a film-shaped electrode formed on both the surfaces (outer two surfaces) of a fired piezoelectric body having a plural layer structure and a film-shaped electrode formed on a surface between single layers. That is, in the structure, a laminate structure of an electrode, a fired piezoelectric body, an electrode, a fired piezoelectric body, and an electrode may be repeated. The number of the lamination in this case is preferably 3 as the number of the fired piezoelectric bodies and 4 as the number of the electrode and may be more.

An embodiment of a method for manufacturing a piezoelectric element of the present invention will be described. In a method for manufacturing a fired piezoelectric body of the present invention, a thin green sheet 21 is manufactured by the use of a piezoelectric material (see step (1) of FIG. 2). Specifically, slurry is prepared by adding, for example, a binder, a solvent, a dispersant, a plasticizer, and the like to a ceramic powder of lead zirconate titanate or the like and mixing them. After the slurry is subjected to a defoaming treatment, a green sheet having the aforementioned thicknesss manufactured by a method such as a reverse roll coater method, a doctor blade method, or the like. Then, the green sheet is cut to have a green sheet 21 having a desired size. The green sheet 21 later functions as a fired piezoelectric body constituting a piezoelectric element.

Figure 2:
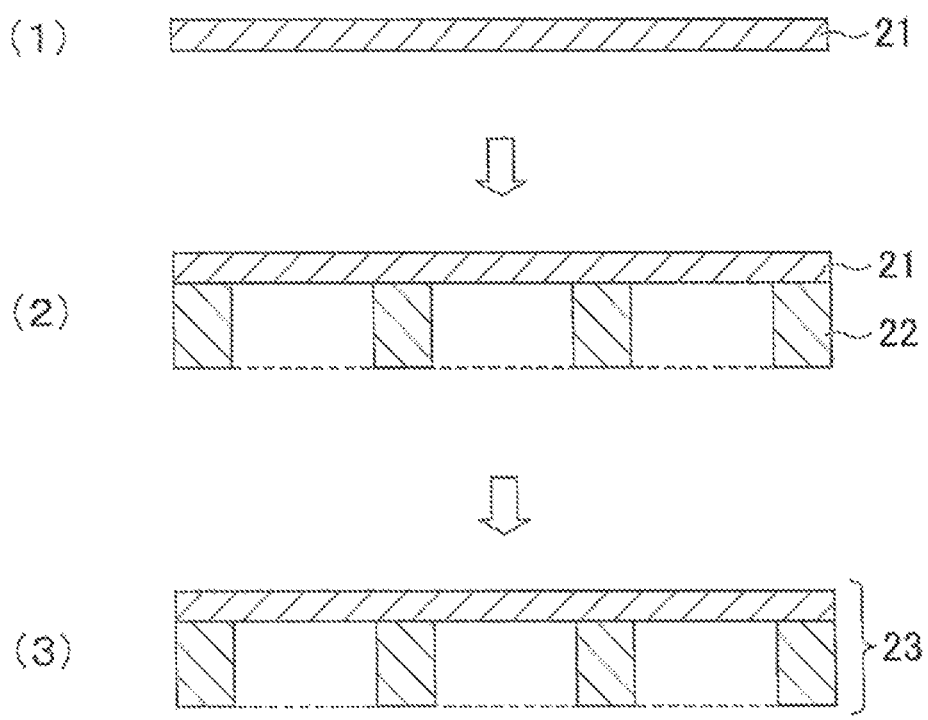
FIG. 2 is a cross-sectional view showing an embodiment of a method for manufacturing a piezoelectric element of the present invention, showing the steps (1) to (3).

Then, a binder, a solvent, a dispersant, a plasticizer, and the like are added to a ceramic powder of lead zirconate titanate or the like, and they are mixed to have a paste, and reinforcers 22 having a desired thickness are formed on the green sheet 21 by screen printing (see the step (2) of FIG. 2).

Subsequently, they are fired at an appropriate temperature of 800 to 1300° C. on the basis of the piezoelectric material to be used to obtain a reinforcer-provided fired piezoelectric body 23 (see the step (3) of FIG. 2 and the step (I) of FIG. 3). The reinforcer-provided fired piezoelectric body 23 means that the reinforcers 22 for firing and the green sheet 21 are unitarily fired.

Though-holes 11 are made in the reinforcer-provided fired piezoelectric body 23 by the use of, for example, a laser (see the step (II) of FIG. 3). The through-holes 11 may be made before manufacturing the reinforcer-provided fired piezoelectric body 23. In this case, the reinforcer-provided fired piezoelectric body 23 can be obtained by forming a green sheet 21 having the through-holes 11 on, for example, a PET (polyethylene telephthalate) film by screen printing; by forming the reinforcers 22 on the green sheet 21 by screen printing; and by firing them at appropriate temperature of 800 to 1300° C. on the basis of the piezoelectric material to be used in a state of having through-holes.

Then, by performing, for example, resist patterning and by applying the paste of a conductive material (e.g., gold), film-shaped electrodes 33 and 34 made of the conductive material (e.g., gold) are formed on both the surfaces of the reinforcer-provided fired piezoelectric body 23 having through-holes 11 therein and in the through-holes 11 (see the step (III) of FIG. 3). The electrodes 33 and 34 can be formed by a sputtering treatment. The patterning may be performed by laser processing.

The reinforcer-provided fired piezoelectric body 23 is further reinforced, and resist patterning is performed to impart a desired shape to the portions functioning as piezoelectric elements (piezoelectric element precursors) later. Specifically, resin 39 is filled into the spaces between the reinforcers of the reinforcer-provided fired piezoelectric body 23 (see the step (IV) of FIG. 3). Then, the resist 38 is applied by, e.g., a light exposure method to the surface of the reinforcer-provided fired piezoelectric body 23 excluding the portion to be removed (see the step (V)) of FIG. 3). The resin 39 may be filled into the spaces between the reinforcers after the resist 38 is applied. Some parts of the reinforcer-provided fired piezoelectric body 23 and electrodes 33 and 34 are cut off by, for example, wet etching or blasting (see the step (VI) of FIG. 3), and the resist 38 is removed by, for example, a remover to obtain piezoelectric element precursors 100B having a desired shape (see the step (VII) of FIG. 3 and FIG. 4). Each of the piezoelectric element precursors 100B functions as a piezoelectric element later and is composed of a fired piezoelectric body 1 (obtained by removing the reinforcers and the like from the reinforcer-provided fired piezoelectric body 23) and electrodes 33 and 34. After the polarization treatment, each of the piezoelectric element precursors 100B is taken out to be able to ship it as a piezoelectric element 100. An example of the desired shape is the shape of the piezoelectric element precursor 100B (see FIG. 4) though there is no limitation on the shape.

Before the polarization treatment, it is important that the piezoelectric element precursor 100B has bonding portions 41, 42 (see FIG. 4). The bonding portions 41, 42 are bonded to the portions not functioning as the piezoelectric element later (frame) in the reinforcer-provided fired piezoelectric body 23. Strictly speaking, the bonding portions 41, 42 are portions where the fired piezoelectric body 1 constituting the piezoelectric element precursor 100B is bonded to the frame. In other words, upon obtaining the piezoelectric element precursors 100B, parts of the reinforcer-provided fired piezoelectric body 23 and electrodes 33, 34 are cut off so that the bonding portions 41, 42 are provided. Before the polarization, the piezoelectric element precursors 100B are not separated from one another.

A power source is connected to the electrodes 33, 34 of the piezoelectric element precursor 100B, and, for example, a voltage of 1 to 16 kV/mm is applied to the fired piezoelectric body 1 of the piezoelectric element precursor 100B in the ambient atmosphere for 1 to 30 minutes to polarize the fired piezoelectric body 1. At this time, the polarization direction is the direction from the electrode 33 toward the electrode 34 (or the opposite direction). The direction is the thickness direction of the piezoelectric element precursor 100B (fired piezoelectric body 1). In addition, the direction perpendicular to the polarization direction is the surface direction of the piezoelectric element precursor 100B (fired piezoelectric body 1). Therefore, the piezoelectric element precursor 100B (fired piezoelectric body 1) bonded to the frame (portions not functioning as the piezoelectric element 100 later in the reinforcer-provided fired piezoelectric body 23) by the bonding portions 41, 42 is fixed at two positions of the bonding portions 41, 42 in a direction perpendicular to the polarization direction during the polarization treatment.

The bonding portions 41, 42 can be defined as fixed portions during the polarization treatment. Since the piezoelectric element precursor 100B (fired piezoelectric body 1) is long in the vertical direction in FIG. 4, the positions where the piezoelectric element precursor 100B (fired piezoelectric body 1) is fixed (fixed portions) are located at both the ends in the longitudinal direction of the piezoelectric element precursor 100B (fired piezoelectric body 1).

Through the aforementioned steps, the piezoelectric element precursors 100B become usable (capable of displacement) piezoelectric elements 100. Then, necessary property tests are performed, and cutting is performed at bonding portions 41, 42 by the use of, for example, a laser beam machine to obtain each piezoelectric element 1 (see the step (VIII) of FIG. 3). Through washing, final inspection (confirmation of appearance and size), the piezoelectric elements 100 can be shipped.

Figure 5:
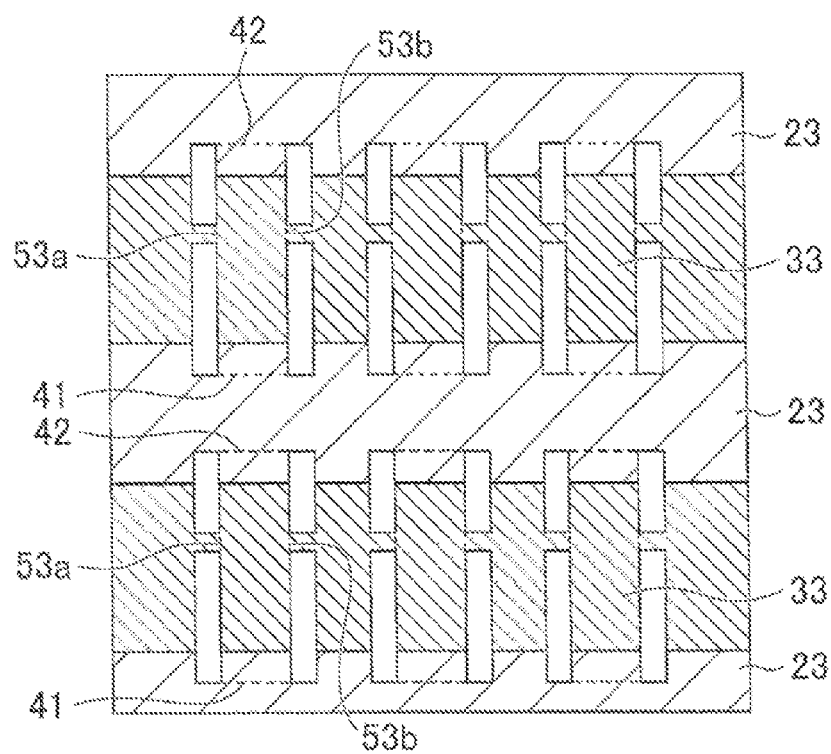
FIG. 5 is a plan view (top view) showing another embodiment of a method for manufacturing a piezoelectric element of the present invention, corresponding to FIG. 4.
Figure 6:
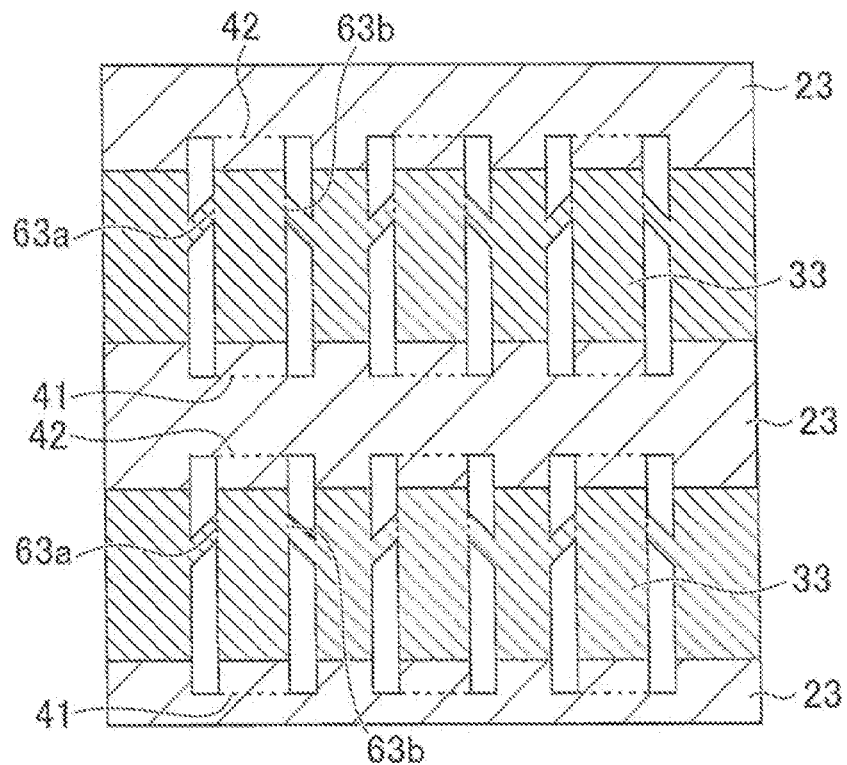
FIG. 6 is a plan view (top view) showing another embodiment of a method for manufacturing a piezoelectric element of the present invention, corresponding to FIG. 4.

As shown in FIGS. 5 and 6, it is preferable that the piezoelectric element precursor has the bonding portions 53a, 53b or the bonding portions 63a, 63b in addition to the bonding portions 41 and 42. In this case, the piezoelectric element precursor (fired piezoelectric body) is fixed at four positions of the bonding portions 41, 42, 53a, and 53b or four positions of 41, 42, 63a, and 63b. In FIG. 5, the piezoelectric element precursors 100B are connected to the frame (portions not functioning as the piezoelectric elements 100 later among the reinforcer-provided fired piezoelectric body 23) perpendicularly to the sides of each piezoelectric element precursor 100B. However, they may obliquely be connected to the frame as in FIG. 6.

Figure 7:
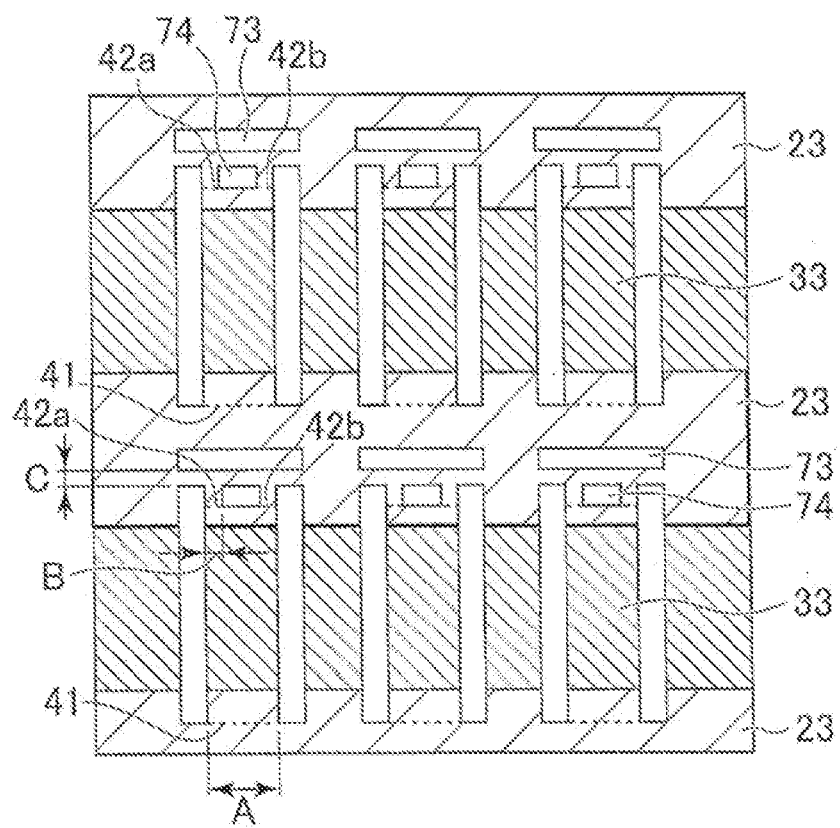
FIG. 7 is plan view (top view) showing another embodiment of a method for manufacturing a piezoelectric element of the present invention, corresponding to FIG. 4.

As shown in FIG. 7, it is preferable to provide through-holes 73, 74 in the frame (portions not functioning as the piezoelectric elements 100 later in the reinforcer-provided fired piezoelectric body 23) in the vicinity of the bonding portions 42. By the presence of the through-hole 74, the piezoelectric element precursor (fired piezoelectric body) is fixed at three portions of bonding portions 41, 42a, and 42b in a direction perpendicular to the polarization direction during the polarization treatment. The through-holes 73 are formed so that the frame is separated in two directions, viewed from the bonding portions 42a, 42b. In this case, the piezoelectric element precursor (fired piezoelectric body) is definitely fixed at three positions of the bonding portions 41, 42a, and 42b in the direction perpendicular to the polarization direction during the polarization treatment. However, since the fired piezoelectric body (piezoelectric element precursor) is fixed by holding the fired piezoelectric body (piezoelectric element precursor) from two directions at the two bonding portions 42a, 42b (fixed portions), the internal stress (deformation stress) to try to cause warpage generated by the polarization can be converted into elongation and deflection deformation in the two directions. When A is defined as the width of the piezoelectric element precursor, B is defined as the width of each of the bonding portions 42a and 42b, and C is defined as the width between the through-holes 73 and 74, it is preferable to have relations of A>B and A>C.

The case of a single layer fired piezoelectric body has been described. In the case that the fired piezoelectric body has two or more layers, in the first place, an internal electrode (electrode to be put between the fired piezoelectric bodies) is separately formed on a green sheet by screen printing or the like. The green sheet is bonded to the aforementioned green sheet 21 (see the step (1) of FIG. 2) in such a manner that the surface having the electrode thereon is located between the sheets to manufacture a laminated green sheet (This step is repeated in the case of three or more layers.). Then, the aforementioned reinforcers 22 (see the step (2) of FIG. 2) are formed on the laminated green sheet by screen printing. Through the steps shown in FIG. 3, a multilayer piezoelectric body can be obtained. At this time, in order to have conduction with the internal electrode, a through-hole or a via-electrode may be formed in the green sheet 21.

The material for the piezoelectric element will hereinbelow be described. There is no particular limitation on the material (piezoelectric material) for the fired piezoelectric body as long as the material causes strain induced by an electric field by the reverse piezoelectric effect or the like and needs polarization. The material can suitably be selected from piezoelectric materials and ferroelectric ceramics depending on the use.

Preferable examples of the material include lead zirconate, lead titanate, lead magnesium niobate, lead nickel niobate, lead nickel tantalate, lead zinc niobate, lead manganese niobate, lead antimony stannate, lead antimony niobate, lead ytterbium niobate, lead manganese tungstate, lead cobalt niobate, lead magnesium tungstate, lead magnesium tantalate, barium titanate, sodium bismuth titanate, bismuth neodymium titanate (BNT), potassium sodium niobate, strontium bismuth tantalate, copper tungsten barium, bismuth ferrate, and a composite oxide of two or more of them. An oxide of rare earth element, calcium, strontium, molybudenum, tungsten, barium, niobium, zinc, nickel, manganese, cadmium, chromium, cobalt, antimony, iron, tantalum, lithium, bismuth, tin, copper, or the like may be added to the above material or substituted for the oxide part of the above material. Among these materials, a material obtained by substituting strontium for a part of lead and substituting niobium for a part of zirconium and/or titanium in a composite oxide of lead zirconate and lead titanate can preferably exhibit high material characteristics. A material obtained by adding, to the above material, lithium bismuthate, lithium borate, lithium carbonate, lead germanate or the like can further preferably exhibit high material property while realizing the firing of the piezoelectric body at low temperature.

The aforementioned piezoelectric material can be used also for the reinforcers. It is preferable to use the same material as that for the fired piezoelectric body to have the same thermal expansion.

As the material for the electrode, a conductive metal is employed. Preferable examples of the conductive metal include single metals of aluminum, titanium, chromium, iron, cobalt, nickel, copper, zinc, niobium, molybdenum, ruthenium, palladium, rhodium, silver, tin, tantalum, tungsten, iridium, platinum, gold, or lead; or alloys of two or more of them, for example, silver-platinum, platinum-palladium, and silver-palladium, which may be used alone or as a combination of two or more of them. There may be used a cermet, a mixture of these materials with aluminum oxide, zirconium oxide, titanium oxide, silicon oxide, cerium oxide, glass, or a piezoelectric material. The material may be selected in accordance with the kind of the piezoelectric material.

EXAMPLE

Hereinbelow, the present invention will be described in more detail with referring to Examples. However, the present invention is by no means limited to these Examples.

Example 1

A piezoelectric element precursor fixed by three bonding portions as one piezoelectric element precursor in FIG. 7 was manufactured according to a method for manufacturing a piezoelectric element of the present invention. Specifically, in the first place, there was obtained a fired piezoelectric body having a rectangular shape of 2 mm×4 mm and a thickness of 15 µm. The thickness of the fired piezoelectric body was 15 µm, and the surface roughness Ra was 0.19 µm on one surface of the fired piezoelectric body while it was 0.1 µm on the other surface. As the piezoelectric material, there was used $0.17Pb(Mg1/3Nb2/3)O_3$-$0.03Pb(Ni1/3Nb2/3)O_3$-$0.43PbTiO_3$-$0.37PbZrO_3$. The same piezoelectric material was used for the reinforcers (corresponding to the reinforcers 22 of the step (2) of FIG. 2) for firing, and the reinforcers were formed by screen printing to have a thickness of 30 µm. The firing was performed at 1200° C. for two hours. Gold (Au) was used for the electrode, which was formed by sputtering. After the electrode was formed, a piezoelectric element precursor was obtained by blasting.

A piezoelectric element was obtained by polarization by applying a voltage of 5 kV/mm to the still fixed piezoelectric element precursor for 15 minutes in room temperature (in the atmosphere). The undulation amount for 10 elements was measured by the use of a laser displacement gauge (LK-G5000) produced by Keyence, and it was 0.2 to 3 µm. Then, a drive durability test was performed by a rectangular wave of 10V at 5 kHz for one hour to confirm that no problem was caused.

Example 2

There was manufactured a piezoelectric element precursor fixed by two bonding portions like one piezoelectric element precursor in FIG. 4, and polarization was performed in the same manner as in Example 1 except for the aforementioned point to obtain a piezoelectric element. The undulation amount for 10 elements was measured, and it was 0.5 to 30 µm. Then, a drive durability test was performed by a rectangular wave of 10V at 5 kHz for one hour to confirm that no problem was caused.

Comparative Example 1

There was manufactured a piezoelectric element precursor having no fixing, and polarization was performed in the same manner as in Example 1 except for the aforementioned point to obtain a piezoelectric element. The undulation amount for 10 elements was measured, and it was 100 to 500 µm.

A method for manufacturing a piezoelectric element of the present invention can suitably be used as a means for manufacturing a piezoelectric element provided on various piezoelectric actuators (piezoelectric devices) applied to measuring instruments, optical modulators, optical switches, microvalves, carrier devices, image displays (display, projector, etc.), image drawing instruments, micropumps, droplet ejectors, micromixers, microstirrers, and microreactors; or various piezoelectric sensors (piezoelectric devices) used for detecting fluid properties, sound pressure, microweight, acceleration, and the like.

What is claimed is:

1. A method for manufacturing a piezoelectric element that is formed by firing a piezoelectric material, each piezoelectric element having a thin board-shaped fired piezoelectric body and a film-shaped electrode formed on both surfaces of the fired piezoelectric body, comprising polarizing a plurality of the fired piezoelectric bodies after fixing each fired piezoelectric body at least at two different positions in a direction perpendicular to a polarization direction; wherein the positions where the thin board-shaped fired piezoelectric body is fixed are cut after the polarization.

2. The method for manufacturing a piezoelectric element according to claim 1, wherein the positions where the thin board-shaped fired piezoelectric body is fixed are at both ends thereof in a longitudinal direction of the fired piezoelectric body.

3. The method for manufacturing a piezoelectric element according to claim 2, wherein the fired piezoelectric body is fixed by holding the fired piezoelectric body from plural directions at the ends where the thin board-shaped fired piezoelectric body is fixed.

4. The method for manufacturing a piezoelectric element according to claim 3, wherein the cutting is performed from one selected from the group consisting of an electron beam, an ion beam, etching, blasting, and laser processing.

5. The method for manufacturing a piezoelectric element according to claim 2, wherein the cutting is performed from one selected from the group consisting of an electron beam, an ion beam, etching, blasting, and laser processing.

6. The method for manufacturing a piezoelectric element according to claim 1, wherein the fired piezoelectric body is fixed by holding the fired piezoelectric body from plural directions at the positions where the thin board-shaped fired piezoelectric body is fixed.

7. The method for manufacturing a piezoelectric element according to claim 6, wherein the cutting is performed from one selected from the group consisting of an electron beam, an ion beam, etching, blasting, and laser processing.

8. The method for manufacturing a piezoelectric element according to claim 1, wherein the cutting is performed from one selected from the group consisting of an electron beam, an ion beam, etching, blasting, and laser processing.

9. The method for manufacturing a piezoelectric element according to claim 1, wherein the fired piezoelectric body is fixed at least at four positions by holding the fired piezoelectric body at both ends thereof in a first direction perpendicular to the polarization direction, and at both ends of the fired piezoelectric body in a second direction perpendicular to the first direction.

10. The method for manufacturing a piezoelectric element according to claim 1, wherein the fired piezoelectric body is fixed at least at three positions by holding the fired piezoelectric body on two opposite ends thereof in the direction perpendicular to the polarization direction, and on at least one of the two opposite ends, the fired piezoelectric body is fixed at least at two positions.

11. The method for manufacturing a piezoelectric element according to claim 1, wherein during the step of polarizing the fired piezoelectric body, the fired piezoelectric body is fixed at least at the two positions in the direction perpendicular to the polarization direction.

12. The method for manufacturing a piezoelectric element according to claim 1, wherein the fired piezoelectric body is fixed at both opposite ends thereof in the direction perpendicular to the polarization direction.

13. A method for polarizing a plurality of fired piezoelectric bodies that are formed by firing a piezoelectric material, where each thin board-shaped fired piezoelectric body is fixed at least at two different positions in a direction perpendicular to a polarization direction and then the fired piezoelectric body is polarized in the polarization direction, wherein the positions where the thin board-shaped fired piezoelectric body is fixed are cut after the polarization.

* * * * *